United States Patent
Arbogast et al.

(10) Patent No.: US 7,056,143 B2
(45) Date of Patent: Jun. 6, 2006

(54) ELECTRONIC DEVICE HAVING REMOVABLE PROCESSOR ASSEMBLY AND METHOD OF OPERATING SAME

(75) Inventors: Porter Arbogast, Fort Collins, CO (US); Arlen L. Roesner, Fort Collins, CO (US); David Mayer, Fort Collins, CO (US); Neil Clark, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 10/400,877

(22) Filed: Mar. 27, 2003

(65) Prior Publication Data

US 2004/0192101 A1    Sep. 30, 2004

(51) Int. Cl.
*H01R 13/627* (2006.01)

(52) U.S. Cl. ............... 439/362; 439/342; 361/697; 361/707; 361/710

(58) Field of Classification Search ............... 439/362, 439/299, 300, 911, 924.2, 342; 361/697, 361/695, 687, 707, 710, 718, 719, 726–728; 257/718, 727; 165/803, 185, 121; 174/16.3
See application file for complete search history.

(56) References Cited

U.S. PATENT DOCUMENTS

| | | | | |
|---|---|---|---|---|
| 4,091,246 A | * | 5/1978 | Donofrio et al. | 200/50.28 |
| 4,387,951 A | * | 6/1983 | Hall et al. | 439/299 |
| 4,420,205 A | | 12/1983 | Kirkman | |
| 4,582,381 A | * | 4/1986 | Bisczat et al. | 439/304 |
| 4,716,495 A | * | 12/1987 | Craker | 361/725 |
| 4,767,347 A | * | 8/1988 | Kamp et al. | 439/133 |
| 4,773,873 A | | 9/1988 | Hillis | |
| 5,017,147 A | * | 5/1991 | Sugiyama et al. | 439/144 |
| 5,542,468 A | | 8/1996 | Lin | |
| 5,668,348 A | | 9/1997 | Lin | |
| 5,707,247 A | | 1/1998 | Konstad | |
| 5,735,701 A | * | 4/1998 | Jarrett | 439/147 |
| 6,111,752 A | | 8/2000 | Huang et al. | |
| 6,115,909 A | | 9/2000 | Miller | |
| 6,118,659 A | | 9/2000 | Adams et al. | |
| 6,175,499 B1 | | 1/2001 | Adams et al. | |
| 6,206,715 B1 | | 3/2001 | Liu et al. | |
| 6,217,361 B1 | | 4/2001 | Murr | |
| 6,219,241 B1 | | 4/2001 | Jones | |
| 6,477,051 B1 | * | 11/2002 | Barsun | 361/704 |
| 6,504,243 B1 | | 1/2003 | Andric et al. | |
| 6,538,889 B1 | * | 3/2003 | Barsun et al. | 361/704 |

* cited by examiner

*Primary Examiner*—Gary F. Paumen

(57) ABSTRACT

An electronic device having a processor assembly. The electronic device comprising a first device connectable to the processor assembly a socket assembly adapted to receive the processor assembly, the socket assembly comprising an actuator operable to secure the processor assembly to the socket assembly; and a movable member adapted to prevent the actuator from being operated with the first device connected to the processor assembly An assembly for coupling a processor to an actuatable socket assembly. The assembly comprises a first member adapted to receive the processor and a second member movable relative to the first member. The second member is adapted to prevent the socket assembly from being actuated when the second member is disposed in a first position.

35 Claims, 7 Drawing Sheets

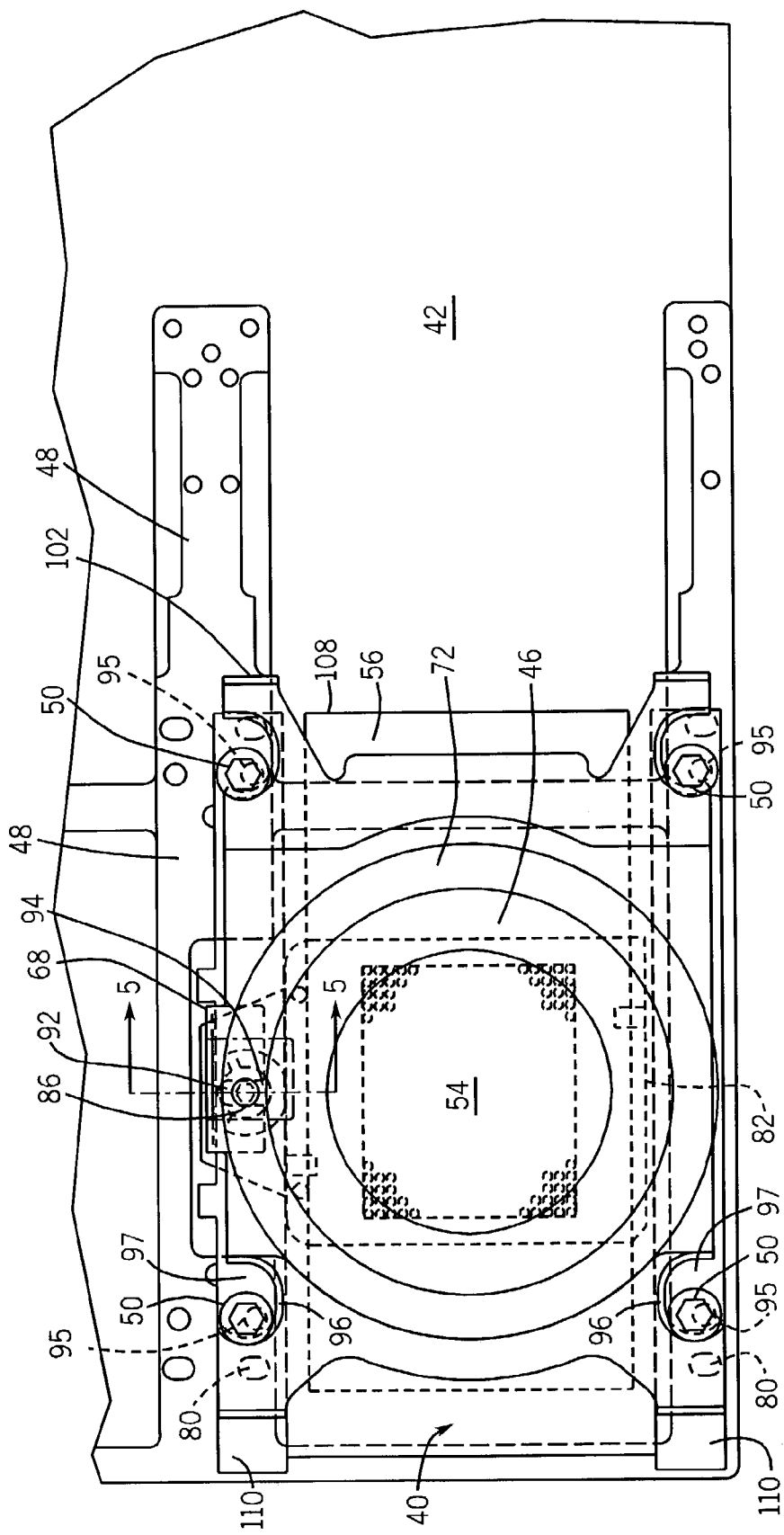

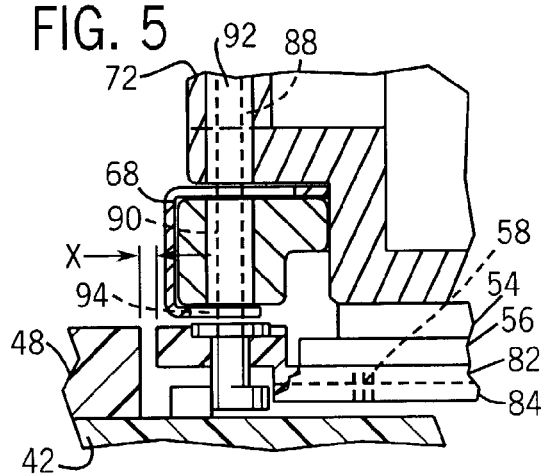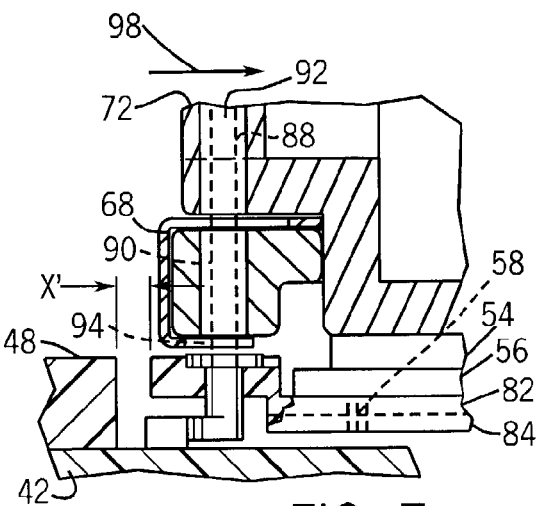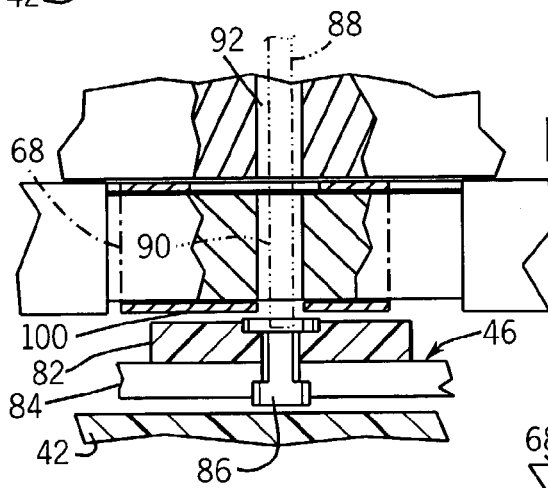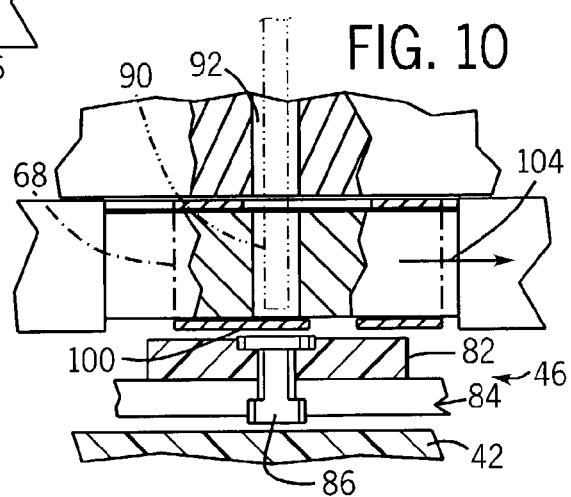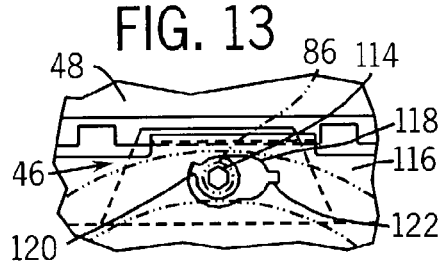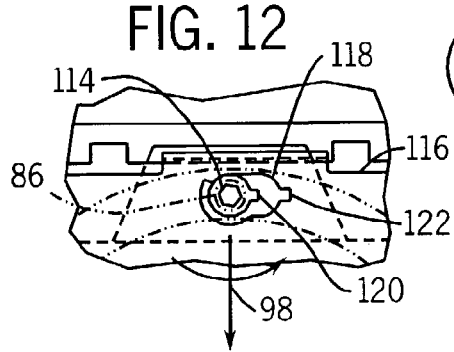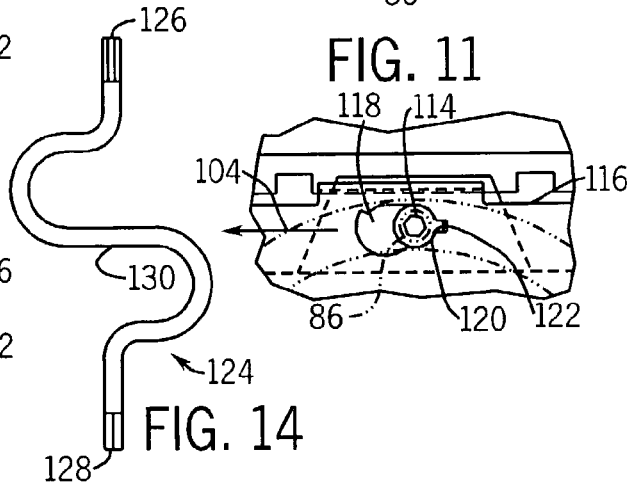

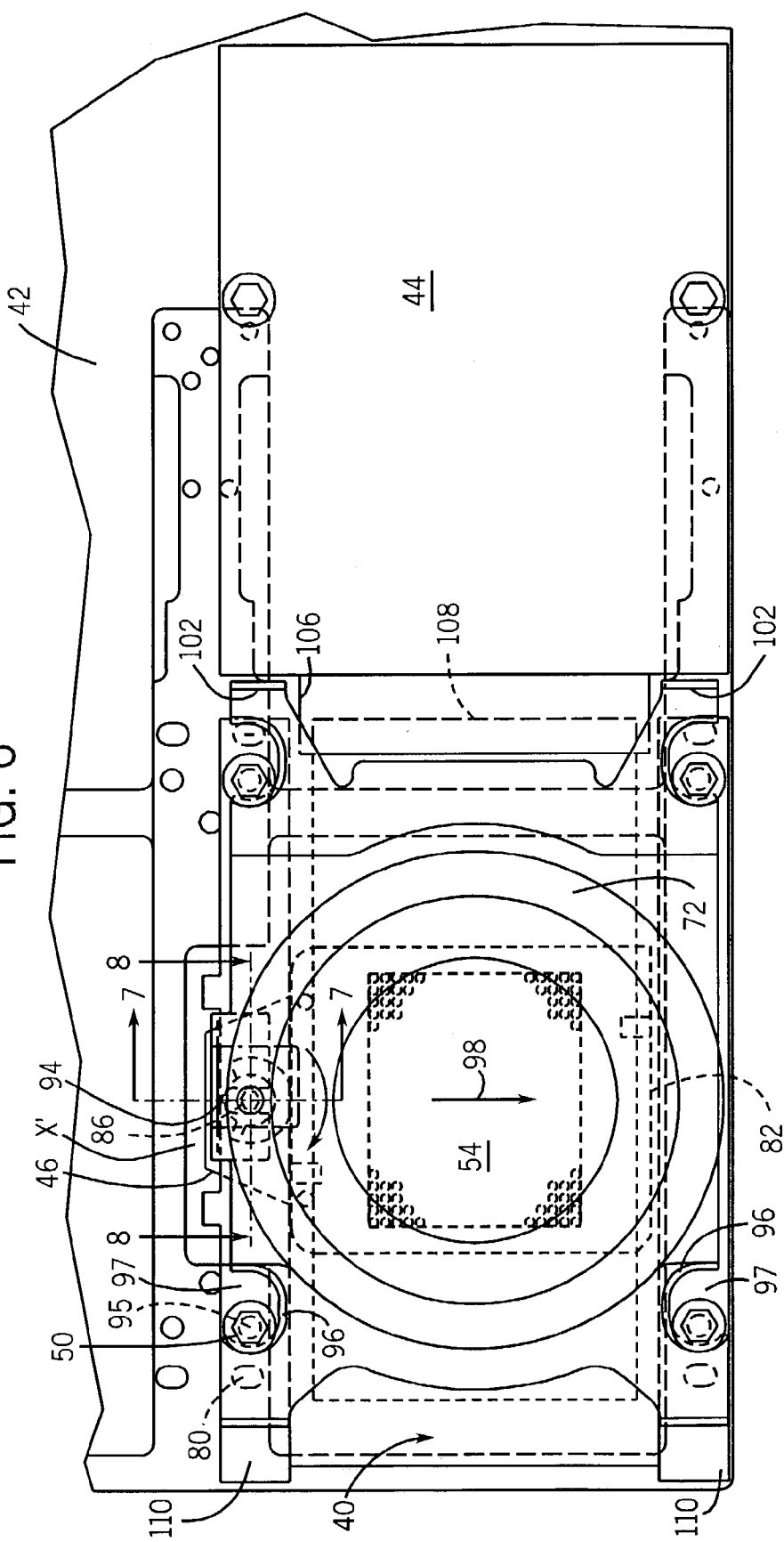

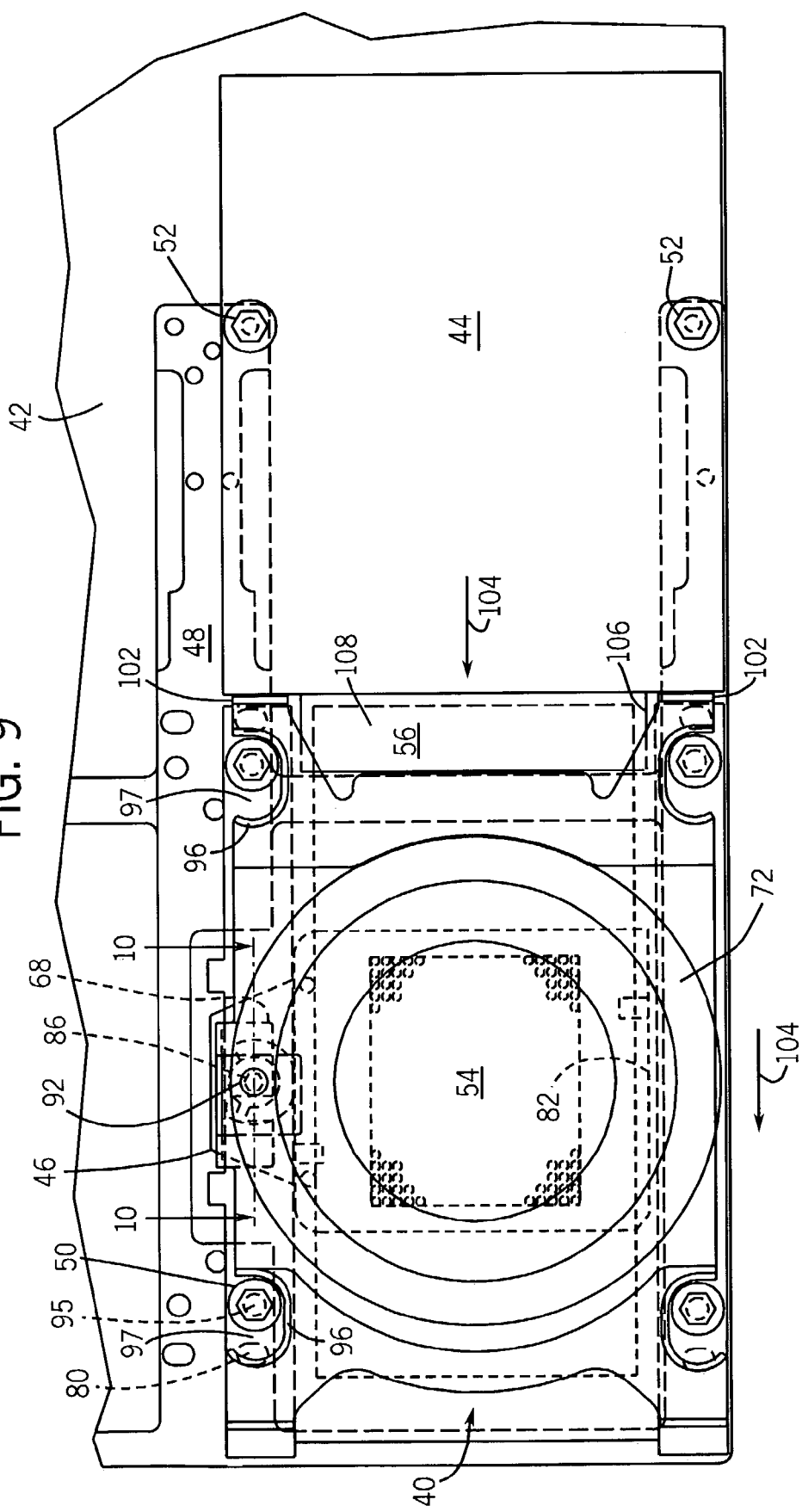

US 7,056,143 B2

ELECTRONIC DEVICE HAVING REMOVABLE PROCESSOR ASSEMBLY AND METHOD OF OPERATING SAME

BACKGROUND OF THE INVENTION

Many electronic systems, such as desktop computers and servers, utilize processors. Typically, a processor is mounted on a socket assembly that electrically couples the processor to a printed circuit board. The socket assembly is secured to the printed circuit board.

Many different types of processors and socket assemblies have been used. The processor may be removable or affixed to the socket, such as by soldering. Some processors have pins that are inserted into corresponding sockets of a socket assembly. Friction between the pins and socket assemblies holds the processor securely to the socket assembly. A sufficient pulling force is applied to the processor to overcome the friction when removal of the processor from the socket is desired.

SUMMARY

According to one embodiment of the present invention, an electronic device comprises a processor assembly, a first device, a socket assembly having an actuator, and a first member. The first member is adapted to prevent the actuator from being operated with the first device connected to the processor assembly.

In another embodiment, an assembly for coupling a processor to an actuatable socket assembly is featured. The assembly comprises a first member adapted to receive the processor and a second member movable relative to the first member. The second member is adapted to prevent the socket assembly from being actuated when the second member is disposed in a first position relative to the first member.

BRIEF DESCRIPTION OF THE DRAWINGS

Exemplary embodiments will hereafter be described with reference to the accompanying drawings, wherein like reference numerals denote like elements, and:

FIG. 4 is a top view of a portion of the electronic device illustrated in FIG. 2, illustrating the position of the processor assembly relative to the socket assembly and system board prior to actuating the socket assembly;

FIG. 5 is a cross-sectional view taken generally along line 5—5 of FIG. 4;

FIG. 6 is a top view of a portion of the electronic device illustrated in FIG. 2, illustrating the position of the processor assembly relative to the socket assembly and system board after actuating the socket assembly;

FIG. 7 is a cross-sectional view taken generally along line 7—7 of FIG. 6;

FIG. 8 is a cross-sectional view taken generally along line 8—8 of FIG. 7;

FIG. 9 is a top view of a portion of the electronic device illustrated in FIG. 2, illustrating the displacement of the movable member by the power pod;

FIG. 10 is a cross-sectional view taken generally along line 10—10 of FIG. 9;

FIG. 11 is a top view of an alternative embodiment of the present mention, illustrating an embodiment of a socket actuator locked from rotating by a movable member;

FIG. 12 is a top view of the alternative embodiment of FIG. 11, illustrating the movable member repositioned to unlock the socket actuator;

FIG. 13 is a top view of the alternative embodiment of FIG. 11, illustrating a socket actuator locked from rotating by a movable member; and FIG. 14 is an elevational view of an embodiment of a tool for operating the socket assembly and retention screws illustrated in FIGS. 2–13.

DETAILED DESCRIPTION

Figure 1:
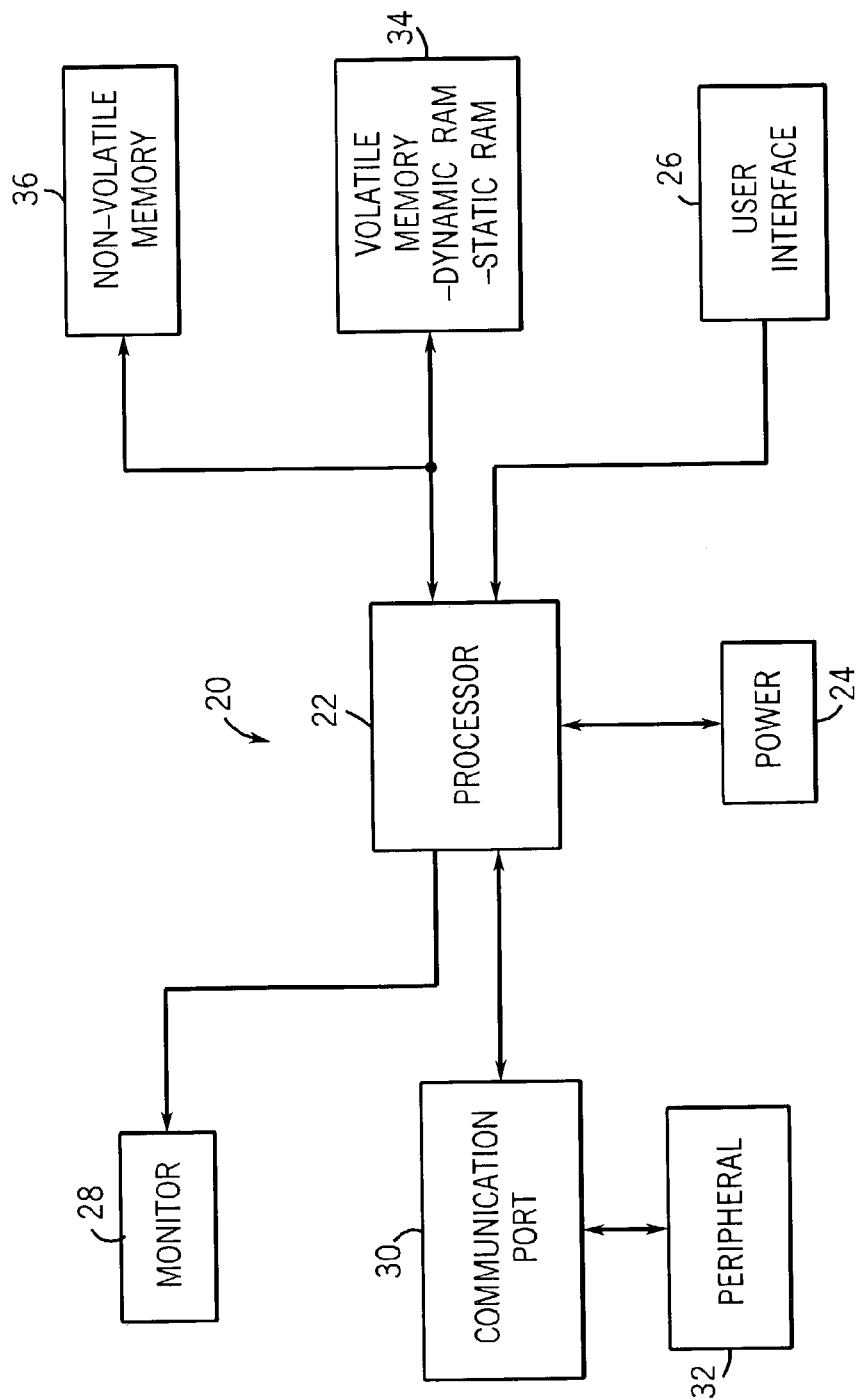
FIG. 1 illustrates a block-diagram of a computer system in accordance with an embodiment of the present invention.

Referring generally to FIG. 1, a block diagram depicting an embodiment of a processor-based device, generally designated by the reference numeral 20, is illustrated. The processor-based device 20 may be any of a variety of different devices, such as a personal computer or a server.

The illustrated processor-based device 20 uses a processor 22 to control the operation of device 20. Processor 22 may be a microprocessor, such as used in a personal computer, or other type of processor., Processor-based device 22 has a power supply 24 to supply power to the other components of the system. Various additional components of system 20 may be coupled to processor 22. For instance, a user interface 26 may be coupled to processor 22 to enable an operator to control some or all of the functions of the device. Examples of user interfaces include a keyboard, a mouse, or a joystick. A monitor 28 may be coupled to the processor 22 to enable an operator to view visual information provided by the device. This information may be displayed on the monitor via a graphical user interface. A communications port 30 may also be used to couple processor 22 to peripheral devices 32, such as a modem or printer.

Programming instructions are typically used to control the operation of a processor and these programming instructions are typically stored in electronic memory. There are several different types of electronic memory available for use in processor-based devices. For example, the processor 22 may be coupled to volatile memory 34. Volatile memory may include dynamic random access memory (DRAM) and/or static random access memory (SRAM) packaged, for example, as a single-inline memory module (SIMM) or as a dual-inline memory module (DIMM). Processor 22 also may be coupled to non-volatile memory 36. Non-volatile memory 36 may include a read only memory (ROM), such as an erasable programmable read-only memory (EPROM), to be used in conjunction with the volatile memory. The non-volatile memory 36 may include a high capacity memory such as a hard disk drive (HDD) or tape drive memory.

Figure 2:
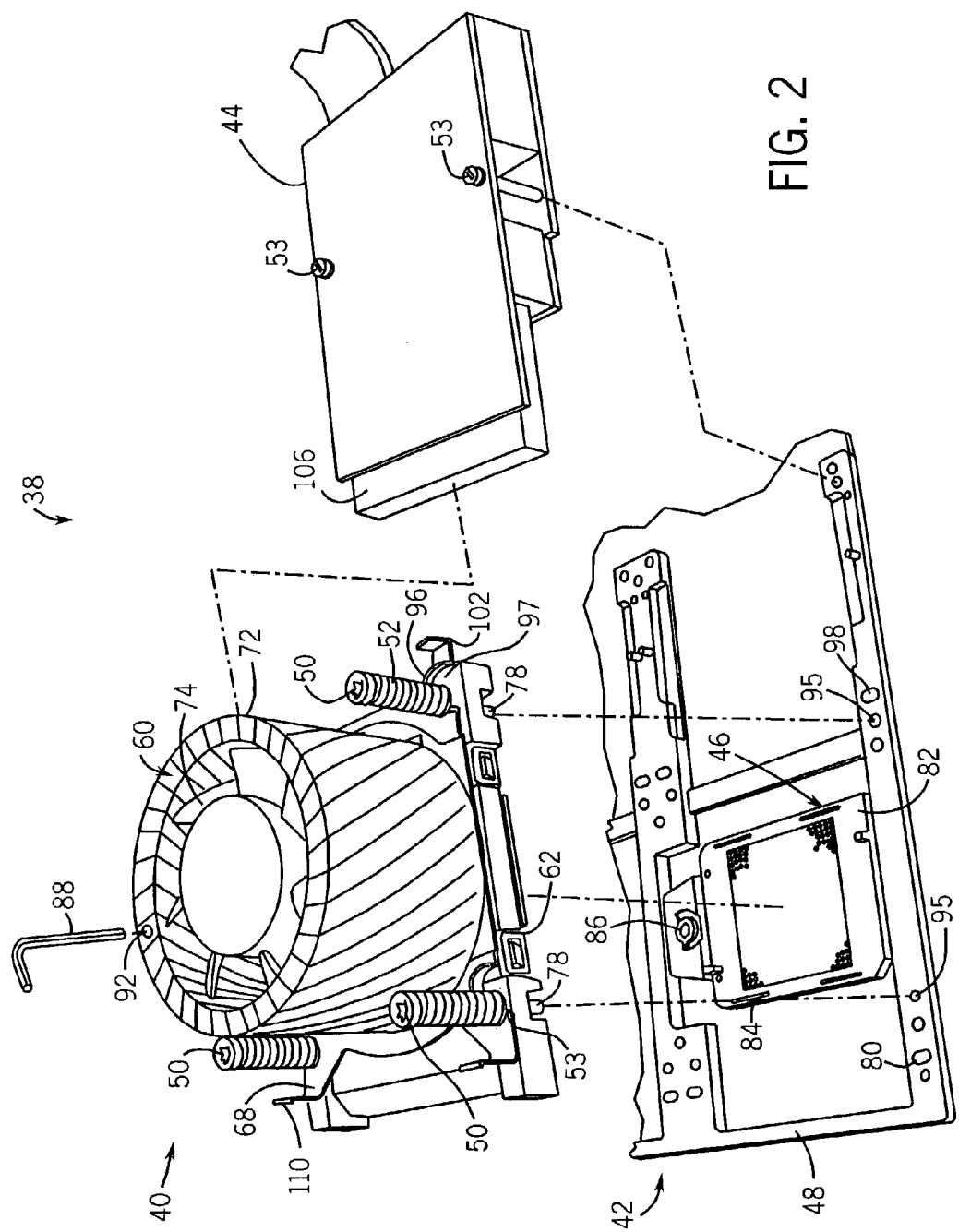
FIG. 2 is a perspective view illustrating part of an embodiment of an electronic device in accordance with an embodiment of the present invention.

Referring generally to FIG. 2, a portion of a processor-based device 38 is illustrated. In the illustrated embodiment, processor-based device 38 comprises a processor assembly 40, a system board 42, and a power pod 44. System board 42 electrically couples processor assembly 40 to other components of processor-based device 38, such as volatile and non-volatile memories. Power pod 44 is connected to processor assembly 40 to provide power thereto.

In the illustrated embodiment, processor assembly 40 is disposed on a socket assembly 46 of system board 42. Socket assembly 46 is operable to electrically couple a processor disposed within processor assembly 40 to system board 42. As illustrated, processor assembly 40 is secured to a frame 48 mounted on system board 42 by four retention screws 50. Each retention screw has a large spring 51 and an e-clip 52 clipped to a slot in each retention screw. The large springs 51 and e-clips 52 are adapted to urge processor assembly 40 against frame 48 as each retention screw 50 is tightened. Power pod 44 is secured to frame 48 of system board 42 by two threaded fasteners 53 in the illustrated embodiment.

Figure 3:
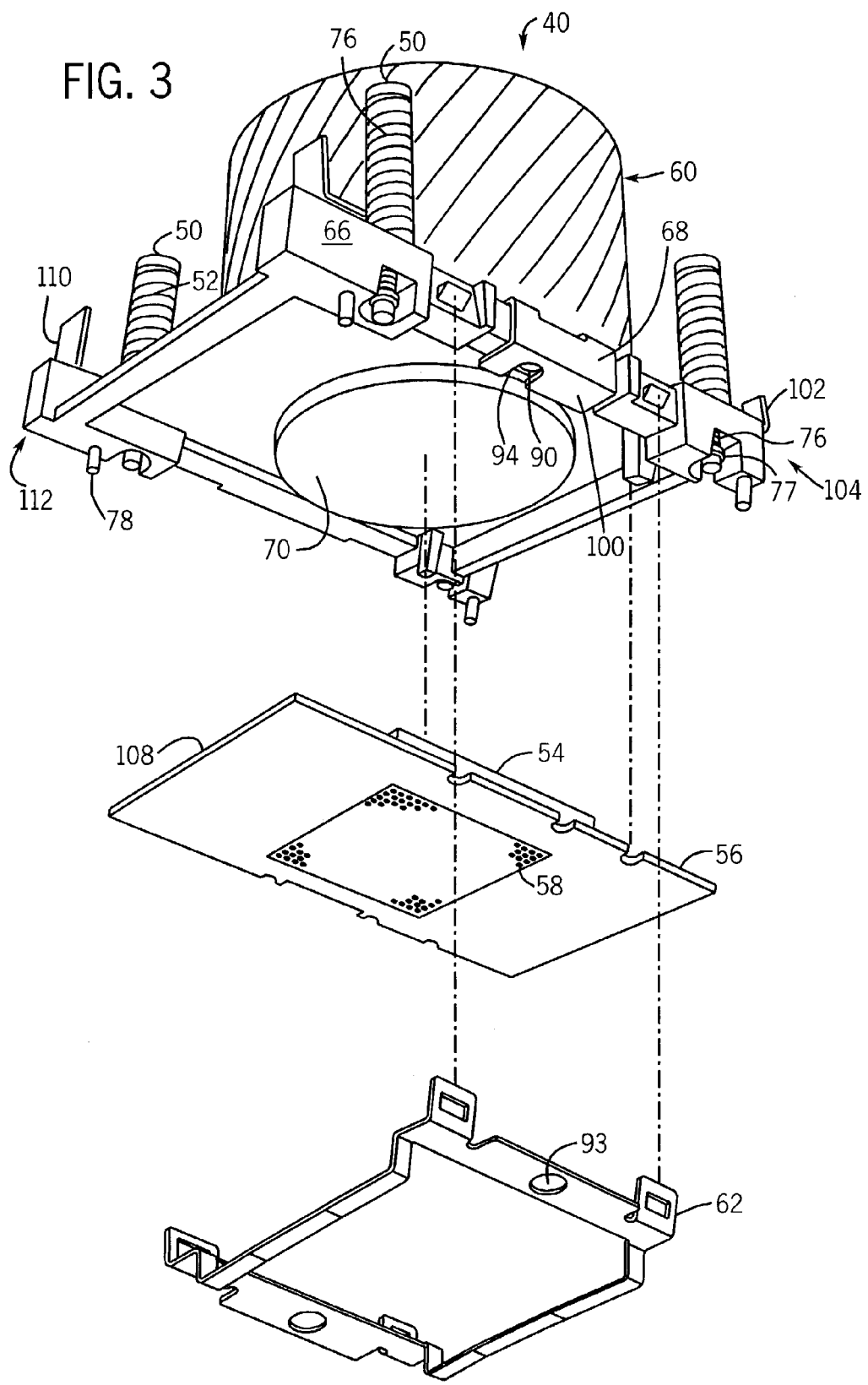
FIG. 3 is an exploded view of a processor assembly illustrated in FIG. 2.

Referring generally to FIG. 3, processor assembly 40 comprises a processor 54 disposed on a processor module 56 having pins 58, a heat sink assembly 60, and a spring clip retainer 62 adapted to secure processor module 56 to heat sink assembly 60. In the illustrated embodiment, heat sink assembly 60 comprises a heat sink 64, a base 66, and a movable member 68. Movable member 68 is movable relative to base 66. Heat sink 64 is secured to base 66, and is adapted to remove heat from processor 54. One embodiment of heat sink 64 has a contact surface 70, cooling fins 72, and a cooling fan 74 (illustrated in FIG. 2). Contact surface 70 is adapted to contact processor 54 and conduct heat generated by processor 54 from processor 54 to heat sink 64. A thermal grease may be used to facilitate thermal conduction between processor 54 and contact surface 70. Heat is conducted from contact surface 70 through heat sink 64 to cooling fins 72. Cooling fan 74 produces a flow of air to remove the heat from cooling fins 72 by convection.

Base 66 of heat sink assembly 60 is adapted to secure heat sink assembly 60 to system board 42. Retention screws 50 extend through base 66. In the illustrated embodiment, each retention screw 50 has a small spring 76 and an e-clip 77 clipped to a slot in each retention screw 50. Small springs 76 and e-clips 77 are adapted to bias the retention screw to a raised/disengaged position. In addition, in this embodiment, base 66 has several guide posts 78 adapted to fit into corresponding guide holes 80 located in frame 48 to guide the processor assembly 40 into proper alignment on system board 42.

Referring generally to FIGS. 2, 4, and 5, socket assembly 46 has an upper socket 82, a lower socket 84 disposed below upper socket 84, and an actuator 86. Processor 54 is disposed onto upper socket 82. In the illustrated embodiment, actuator 86 is adapted to be operated by inserting a removable hex wrench 88 through movable member 68 into actuator 86 and rotating actuator 86 in a clockwise direction. When actuated, actuator 86 moves upper socket 82 relative to lower socket 84, causing pins 58 to be captured by friction between upper socket 82 and lower socket 84, thereby securing processor assembly 40 to socket assembly 46.

The displacement of processor 54 relative to other components of the device during operation of socket assembly 46 can cause damage to processor 54 if a proper sequence of operation is not followed during either installation or removal of the processor. One sequence of installing processor assembly 40 and power pod 44 is as follows: (1) dispose processor assembly 40 onto socket assembly 45; (2) actuate socket assembly 46 to lock processor assembly 40 to socket assembly 46; (3) shift movable member; (4) tighten retention screws 50 to frame 48; (5) connect power pod 44 to processor assembly 40; and (6) tighten power pod screws to frame 48. Movable member 68 is adapted to ensure processor assembly 40 is installed and removed in a desired sequence of operations.

Referring generally to FIGS. 2–5, when processor assembly 40 is positioned on system board 42, base 66 is disposed over actuator 86 of heat sink assembly 60. Base 66 has a hole 90 that extends therethrough. Heat sink 64 has a corresponding hole 92 that extends through heat sink 64 and is aligned with hole 90 in base 66. In addition, clip 62 has a corresponding hole 93 that is aligned with hole 90 and hole 92. Movable member 68 has a notched portion 94 that may be aligned with hole 90, hole 92, and hole 93 to enable hex wrench 88 to be inserted into actuator 86 to operate actuator 86 if power pod 44 is not connected to processor assembly 40. If not already done, movable member 68 may be moved to align notched portion 94 with holes 90, 92, and 93.

Movable member 68 has a plurality of flanged portions 96 that surround notches 97. As discussed above, small springs 76 urge retention screws 50 upward to disengage the retention screws. When movable member 68 is positioned to align notched portion 94 with holes 90, 92, and 93, flanged portions 96 are disposed below large springs 52 and e-clips 53. In this orientation, each retention screw 50 is obstructed from downward movement by the e-clips contacting a flanged portion 96, thereby preventing the retention screws from being tightened with movable member 68 positioned to enable actuator 86 to be actuated by hex wrench 88. In addition, before actuation of socket assembly 46, processor assembly 40 is disposed on frame 48 such that retaining screws 50 and corresponding threaded portions 95 of frame 48 are misaligned.

Referring generally to FIGS. 6–8, as socket assembly 46 is actuated, processor assembly 40 is moved in a first direction relative to system board 42, as represented by arrow 98. In addition, processor assembly 40 is positioned relative to frame 48 such that retaining screws 50 and corresponding threaded portions 95 of frame 48 are aligned 95.

Referring again to FIGS. 3, 9, and 10, as discussed above, movable member 68 is adapted to ensure that socket assembly 46 is not actuated with power pod 44 connected to processor assembly 40 and that retention screws 50 are not tightened to frame 48 until after socket assembly 46 is actuated during installation of processor assembly 40. Movable member 68 has a blocking portion 100 that is disposed to prevent hex wrench 88 from being inserted into actuator 86 to operate actuator 86 when power pod 44 is connected to processor assembly 40 or when retention screws 50 are tightened onto frame 48. Movable member 68 has a first pair of wings 102 that are contacted by power pod 44 as power pod 44 is connected to processor assembly 40.

If movable member 68 has not been moved previously, as power pod 44 is connected to processor assembly 40, power pod 44 contacts first pair of wings 102 and urges movable member 68 in a first direction, as represented by arrow 104. This action causes blocking portion 100 to be moved to a position such that it blocks access to socket actuator 86. In addition, each notched portion 97 is disposed below each large spring 52 and each e-clip 53, removing each flanged portion 96 as an obstruction to downward movement of each e-clip 53. This enables each retention screws 50 to be threaded into holes 95 of frame 48, securing processor assembly 40 to frame 48.

Referring again to FIGS. 2 and 3, when power pod 44 is connected to processor assembly 40, an edge connector 106 of power pod 44 is connected to a corresponding edge connector 108 of processor module 56. The edge connectors could be damaged if the actuator 86 were operated with power pod 44 connected to processor assembly 40. Blocking access to actuator 86 prevents the socket assembly 46 from being actuated while the edge connectors are connected, thereby preventing potential damage to the edge connectors.

Referring generally to FIG. 3, the movable member 68 also is adapted to ensure a desired sequence of operations during removal of processor assembly 40. A sequence of removing processor assembly 40 and power pod 44 is as follows: (1) remove power pod screws; (2) remove power pod 44 from processor assembly 40; (3) loosen retention screws 50 from frame 48; (4) shift movable member; (5) unlock socket assembly to release processor assembly 40; and (6) lift processor assembly 40 from socket assembly 46.

Power pod screws 53 may be removed to enable power pod 44 to be displaced relative to processor assembly 40. In this embodiment, movable member 68 also is prevented from moving to enable access to actuator 86 by retention screws 50. Each spring 52 and/or e-clip 53 obstructs a flanged portion 96 of movable member 68 when retention screws 50 are tightened, preventing movable member 86 from being moved until retention screws 50 are loosened. Once retention screws 50 are loosened and power pod 44 is displaced, movable member 68 may be moved. A second pair of wings 110 of movable member 68 may be contacted to urge movable member 68 in a second direction, as represented by arrow 112, to realign notched portion 94 with hole 90 of heat sink assembly 60 and hole 92 of base 66. This enables hex wrench 88 to be inserted into actuator 86 to release processor assembly 40. Processor assembly 40 may then be removed from socket assembly 46.

An alternative embodiment is illustrated in FIGS. 11–13. In the alternative embodiment, a captive operator 114 is used. In this embodiment, captive operator 114 is disposed within socket actuator 86 and secured to processor assembly 40, such as by a clip. In addition, rather than blocking captive operator 114, a movable member 116 is utilized to prevent captive operator 114 from rotating socket actuator 86 when power pod 44 is connected to processor assembly 40. Captive operator 114 is disposed through a slot 118 in movable member 116. Captive operator 114 has a keyed portion 120 that is disposed within slot 118.

As illustrated in FIG. 11, movable member 116 is moved in the direction represented by arrow 104 when power pod 44 is connected to processor assembly 40. Keyed portion 120 of captive operator 114 is disposed within a corresponding keyway 122 within slot 118, preventing keyed portion 120 of captive operator 114 from rotating. Power pod 44 is removed and movable member 116 returned to a position whereby keyed portion 120 is free to rotate before actuator 86 may be actuated to release processor assembly 40. As illustrated in FIGS. 12 and 13, captive operator 114 is free to rotate to actuate socket assembly 46 when power pod 44 is not connected to processor assembly 40.

Referring generally to FIG. 14, an alternative embodiment of a removable tool 124 for securing processor assembly 40 is illustrated. In the illustrated embodiment, tool 124 has a hex end 126 and a torx end 128. Hex end 126 is adapted to extend through processor assembly 40 to operate actuator 86. Torx end 128 is adapted to operate retention screws 50. A manual manipulator 130 is provided to enable tool 124 to be rotated manually.

While the subject matter may be susceptible to various modifications and alternative forms, specific embodiments have been shown by way of example in the drawings and will be described in detail herein. However, it should be understood that the subject matter is not intended to be limited to the particular forms disclosed. Rather, the subject matter is to cover all modifications, equivalents and alternatives falling within the spirit and scope of the subject matter as defined by the following appended claims.

What is claimed is:

1. An electronic device, comprising:
   a processor assembly;
   a socket assembly adapted to receive the processor assembly, the socket assembly comprising an actuator operable to secure the processor assembly to the socket assembly; and
   a movable member adapted to prevent the actuator from being operated with a first device connected to the processor assembly.

2. The device as recited in claim 1, wherein the movable member is adapted to be disposed relative to the processor assembly to enable the actuator to be operated.

3. The device as recited in claim 2, comprising:
   a fixed member disposed within the electronic device; and
   at least one fastener adapted to secure the processor assembly to the fixed member, wherein the movable member is adapted to prevent the at least one fastener from being fastened to the fixed member when the movable member is disposed relative to the socket assembly to enable the actuator to be operated.

4. The device as recited in claim 3, wherein the movable member is adapted to prevent the movable member from being moved when the at least one fastener is fastened to the fixed member.

5. The device as recited in claim 1, wherein the socket assembly comprises a first portion and a second portion adapted to receive the processor assembly, the second portion being displaced relative to the first portion when the actuator is operated.

6. The device as recited in claim 1, wherein the actuator is operable to release the processor assembly from the socket assembly.

7. The device as recited in claim 1, comprising the first device, wherein the first device is a power pod adapted to provide power to the processor assembly, the power pod comprising a first electrical connector and the processor comprising a second electrical connector, the first and second electrical connectors adapted for mating engagement.

8. The device as recited in claim 1, wherein the processor assembly comprises an opening therethrough to enable an actuator operator to extend through the processor assembly to the actuator.

9. The device as recited in claim 1, wherein the movable member is movable relative to the processor assembly, the movable member being secured by the first device at a first position relative to the processor assembly when the first device is connected to the processor assembly.

10. The device as recited in claim 1, wherein the movable member prevents an operator from extending through the processor assembly to the actuator when disposed in a first position.

11. The device as recited in claim 1, wherein the movable member prevents an operator from rotating to operate the actuator when disposed in a first position.

12. The device as recited in claim 1, comprising a removable operator adapted to operate the actuator and to operate a fastener operable to secure the processor assembly to a system board.

13. The electronic device as recited in claim 1, wherein the movable member is adapted to move along a linear path including a first position and a second position.

14. The electronic device as recited in claim 13, wherein the movable member prevents the actuator from being operated in the first position and the movable member enables the actuator to be operated in the second position.

15. An assembly, comprising:
a first member securable to a processor; and
a second member movable relative to the first member, the second member adapted to be moved by a first device to a first position relative to the first member when the first device is connected to the assembly,
wherein the second member prevents an actuator from being operated when the second member is disposed in the first position,
wherein the second member is non-rotatable.

16. The assembly as recited in claim 15, wherein the second member is adapted to be movable to a second position relative to the first member, the second member enabling the actuator to be operated when the second member is disposed in the second position.

17. The assembly as recited in claim 16, comprising at least one fastener adapted to secure the processor to a circuit board, wherein the second member is adapted to prevent the at least one fastener from being fastened to the circuit board when the second member is disposed in the second position relative to the first member.

18. The assembly as recited in claim 17, wherein the second member is adapted to prevent the second member from being moved to the first position when the at least one fastener is fastened to the circuit board.

19. The assembly as recited in claim 15, wherein the actuator is operated by rotating an operator coupled to the actuator.

20. The assembly as recited in claim 19, wherein the second member prevents the operator from being coupled to the actuator when disposed in the first position.

21. The assembly as recited in claim 20, wherein the second member enables the operator to be coupled to the actuator when disposed in the second position.

22. The assembly as recited in claim 19, wherein the second member prevents the operator from rotating the actuator when disposed in the first position.

23. The assembly as recited in claim 22, wherein the second member enables the operator to rotate the actuator when disposed in the second position.

24. The assembly as recited in claim 15, wherein the second member is linearly movable across the actuator.

25. The assembly as recited in claim 15, wherein the second member is adapted to move independently from fastening or unfastening the first member relative to a third member.

26. The assembly as recited in claim 15, wherein the second member is disposed mostly at a bottom region of the first member.

27. A method of securing a processor assembly to an electronic device, comprising:
operating an actuator of a socket assembly to secure a processor assembly to the socket assembly; and
displacing a movable member to a first position wherein the actuator is prevented from being operated, wherein displacing comprises linearly moving the movable member from a second position to the first position.

28. The method as recited in claim 27, wherein operating an actuator of the socket assembly comprises rotating the actuator with an operator.

29. The method as recited in claim 28, wherein operating an actuator of the socket assembly comprises displacing the processor assembly relative to the electronic device.

30. The method as recited in claim 27, further comprising connecting a power pod to the processor assembly, wherein the power pod prevents the movable member from being moved to a second position to enable the actuator to be operated.

31. The method as recited in claim 30, further comprising securing at least one fastener to a system board to secure the processor assembly to the system board, wherein the movable member prevents the at least one fastener from being fastened to the system board when the movable member is disposed in the second position.

32. The method as recited in claim 30, further comprising securing at least one fastener to a system board to secure the processor assembly to the system board, wherein the at least one fastener prevents the movable member from being disposed in the second position when the at least one fastener is fastened to the system board.

33. The method as recited in claim 27, wherein displacing comprises covering the actuator in close proximity to an access opening extending to the actuator.

34. An assembly comprising:
a first member securable to a processor; and
a second member movable relative to the first member, the second member adapted to be moved by a first device to a first position relative to the first member when the first device is connected to the assembly,
wherein the second member prevents an actuator from being operated when the second member is disposed in the first position,
wherein the second member is slidingly coupled to the first member.

35. An assembly comprising:
a first member securable to a processor; and
a second member movable relative to the first member, the second member adapted to be moved by a first device to a first position relative to the first member when the first device is connected to the assembly,
wherein the second member prevents an actuator from being operated when the second member is disposed in the first position,
wherein a top of the second member is disposed below a topside of the first member.

* * * * *